(12) United States Patent
Flory

(10) Patent No.: US 7,003,185 B2
(45) Date of Patent: Feb. 21, 2006

(54) RESONANT COUPLING OF OPTICAL SIGNALS FOR OUT-OF-PLANE TRANSMISSION

(75) Inventor: Curt A. Flory, Los Altos, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 62 days.

(21) Appl. No.: 10/123,656

(22) Filed: Apr. 16, 2002

(65) Prior Publication Data

US 2003/0194169 A1 Oct. 16, 2003

(51) Int. Cl.
G02B 6/26 (2006.01)

(52) U.S. Cl. ........................................ 385/15
(58) Field of Classification Search ............... 385/15, 385/27, 28, 31, 39, 41, 42, 14, 9, 32, 40, 385/5, 129–132; 372/99, 102, 108, 96, 50, 372/6, 92; 359/346, 347
See application file for complete search history.

(56) References Cited

U.S. PATENT DOCUMENTS

| | | | | | |
|---|---|---|---|---|---|
| 4,592,043 A | * | 5/1986 | Williams | ...................... | 385/18 |
| 4,720,160 A | * | 1/1988 | Hicks, Jr. | ...................... | 385/31 |
| 4,852,117 A | * | 7/1989 | Po | .............................. | 372/97 |
| 4,955,028 A | * | 9/1990 | Alferness et al. | ............ | 372/20 |
| 4,957,337 A | * | 9/1990 | Ogawa et al. | .................. | 385/1 |
| 5,022,730 A | * | 6/1991 | Cimini et al. | .................. | 385/27 |
| 5,220,577 A | * | 6/1993 | Opower | ....................... | 372/92 |
| 5,357,591 A | * | 10/1994 | Jiang et al. | ................... | 385/37 |
| 5,647,036 A | * | 7/1997 | Deacon et al. | ................ | 385/27 |
| 5,734,174 A | * | 3/1998 | Horiguchi | ..................... | 257/17 |
| 5,828,688 A | * | 10/1998 | Cook et al. | ..................... | 372/96 |
| 6,052,495 A | * | 4/2000 | Little et al. | ..................... | 385/2 |
| 6,515,305 B1 | * | 2/2003 | Gopinath | ...................... | 257/79 |
| 6,580,739 B1 | * | 6/2003 | Coldren | ....................... | 372/50 |
| 6,608,947 B1 | * | 8/2003 | Margalit et al. | ............. | 385/14 |
| 6,668,000 B1 | * | 12/2003 | Choa | ........................... | 372/43 |

FOREIGN PATENT DOCUMENTS

| | | |
|---|---|---|
| EP | 1 176 438 | 2/2000 |
| GB | 2 366 666 | 9/2000 |
| WO | WO01/63336 | 2/2001 |

* cited by examiner

Primary Examiner—Joseph Williams
Assistant Examiner—Peter Macchiarolo

(57) ABSTRACT

Optically resonant systems for redirecting optical signals are provided. A representative optically resonant system includes a first structure in a plane. The first structure reflects optical radiation in a first direction substantially orthogonal to the plane. The optically resonant system further includes a second structure overlapping the first structure. The second structure optically communicates with the first structure, and reflects optical radiation substantially parallel to the plane. The first and second structures operate to capture at least a portion of a first optical signal propagating substantially parallel to said plane by exciting a resonant signal in the resonant cavity through the resonant characteristics of the first and second structures. The first and second structures further operate to emit said resonant signal in a second direction substantially orthogonal to said plane. Methods and other optically resonant systems also are provided.

23 Claims, 9 Drawing Sheets

RESONANT COUPLING OF OPTICAL SIGNALS FOR OUT-OF-PLANE TRANSMISSION

FIELD OF THE INVENTION

The present invention is generally related to optics and, more particularly, to systems and methods for redirecting optical signals.

DESCRIPTION OF THE RELATED ART

Integrated optical devices are rapidly achieving signal generation and processing functionality previously restricted to the purely electronic domain. These devices, which are typically planar, normally include a planar waveguide supported by a substrate, the planar waveguide confining light in the substrate. Problems exist, however, coupling an optical signal out of a planar waveguide for either free space transmission or, more typically, coupling to an optical fiber. These problems are difficult to solve efficiently, and in the past, engineers have used various solutions with varying degrees of success. These solutions can generally be divided into two categories: end-fire emission and controlled surface emission.

End-fire emission is a simplistic way to extract light from a planar waveguide. In end-fire emission, a waveguide carries the light to the edge or "end" of a substrate. The light then radiates out of the edge of the waveguide. The end-fire emission solution generally only works if a clean edge of the substrate is available, which is often not the case. Further, as electronics are made smaller and smaller, optics used to focus and/or match the light to or from an optical fiber take up too much space.

Controlled surface emission, on the other hand, is widely seen as the solution to at least some of the problems associated with end-fire emission. There presently exist two general surface emission techniques: prism-based and grating-based. The prism-based technique involves placing a prism on top of a waveguide and refracting emissions from the waveguide. Using the prism-based method, however, is impractical. This is because the prism-based technique involves placing a bulk optical component over the waveguide with relative precision. The grating-based technique involves etching a grating, i.e. multiple notches, into the surface of a waveguide. The grating causes some of the light propagating in the waveguide to leak out of the substrate surface. However, the grating produces diffuse light that is diffracted into a multitude of directions. Further, these controlled surface emission techniques tend to suffer from the standpoint that both of them are distributed in nature, which can cause spatial distortion and expansion of an extracted mode of the light. As such, these outputs can be difficult to match to an optical fiber.

Therefore, there is a need for systems and methods that address these and/or other perceived shortcomings of the prior art.

SUMMARY OF THE INVENTION

The present invention provides systems and methods for redirecting optical signals. In particular, the invention involves the use of a resonant structure that allows an optical input signal to be redirected in a direction that can be normal to the plane of propagation of the optical input signal. In this regard, an optically resonant system of the invention includes a first structure residing substantially in a plane. The first structure reflects optical radiation in a first direction substantially orthogonal to the plane. The optically resonant system also includes a second structure overlapping, and optically communicating with the first structure. The second structure reflects optical radiation in a direction substantially parallel to the plane. The first and second structures operate to capture a at least a portion of a first optical signal propagating substantially parallel to the plane by exciting a resonant signal in a resonant cavity through resonant characteristics of the first and second structures. The first and second structures further operate to emit the resonant signal propagating in a second direction substantially orthogonal to the plane.

The present invention is particularly useful as an integrated optical device residing in an optical substrate. In particular, such an integrated optical device can be used to couple an optical wave travelling in the substrate to an optical fiber for transport or to another integrated optical device located on another substrate, for example.

Another embodiment of an optically resonant system includes a resonant cavity. The resonant cavity of the optically resonant system receives a first optical signal exhibiting a directional component. The resonant cavity includes a resonant characteristic, resonating in response to the first optical signal to excite and emit a resonant signal. The emitted resonant signal has a directional component different than the directional component of the first optical signal.

A method for making an optically resonant system includes: overlapping a first structure residing substantially in a plane with a second structure operable to optically communicate with the first structure, and defining a resonant optical cavity to capture optical energy from a first optical signal, the resonant optical cavity being at least partly surrounded by the first and second structures.

A method for redirecting optical radiation includes: receiving a first optical signal exhibiting a directional component and including at least one wavelength; exciting a resonant signal with the first optical signal at said at least one wavelength; and emitting the resonant signal, the resonant signal exhibiting a directional component different than the directional component of the first optical signal.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

The invention now will be described more fully with reference to the accompanying drawings. The invention may, however, be embodied in many different forms and should not be construed as limited lo the embodiments set forth herein; rather, these embodiments are intended to convey the scope of the invention to those skilled in the art. Furthermore, all "examples" given herein are intended to be non-limiting.

Figure 1:
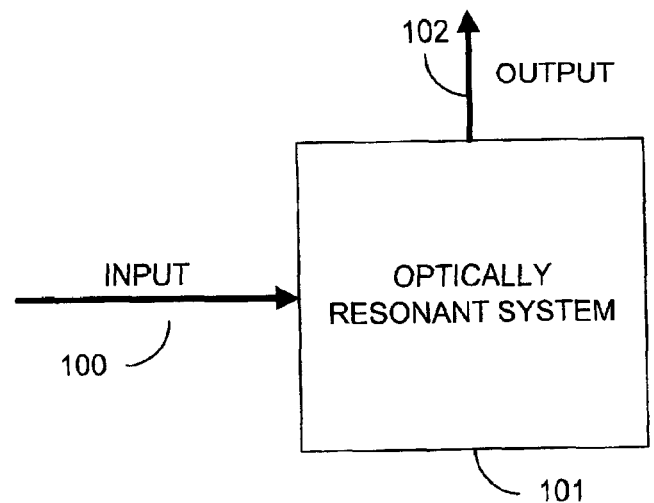
FIG. 1 is a block diagram illustrating an embodiment of an optically resonant system of the present invention.

Referring now to FIG. 1, shown is a block diagram illustrating an embodiment of the present invention. In FIG. 1, an optical input signal 100 is provided to an optically resonant system 101. The optically resonant system 101 captures energy of the optical input signal 100 through resonant characteristics of the optically resonant system 101. The optically resonant system 101 then emits an optical output signal 102. By way of example, the optical output signal could be emitted orthogonal to the optical input signal 100.

The optical input signal 100 in different embodiments could be travelling in a number of different media, including an optical fiber waveguide, a dielectric waveguide, free space, etc. The optical output signal 102 that is emitted may be attenuated, but typically retains any "information content" that may have been encoded on the optical input signal 100. The optical output signal 102 in one embodiment among others, has an axially symmetric radiation pattern that is ideal for coupling the output signal into an optical fiber, or another integrated optical device.

Figure 2:
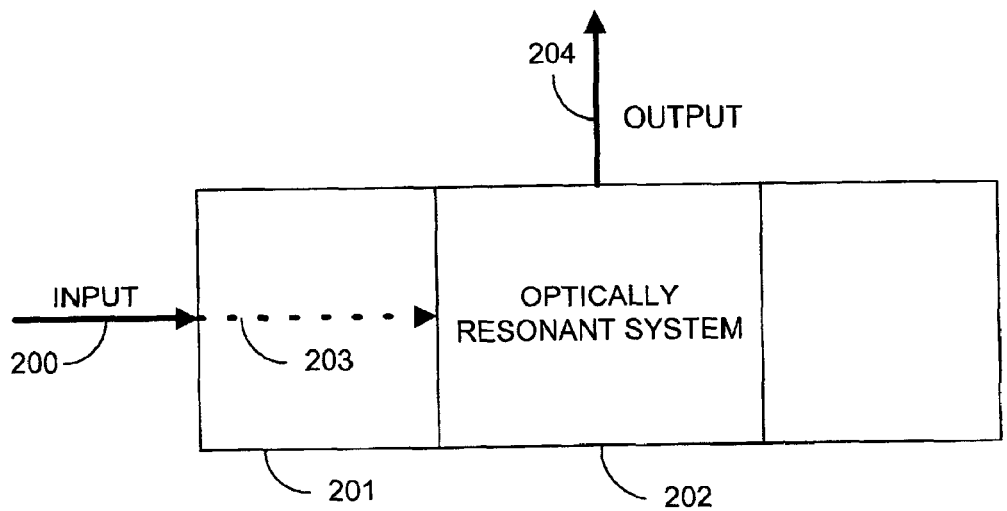
FIG. 2 is a block diagram illustrating an alternative embodiment of an optically resonant system of the present invention.

Referring now to FIG. 2, shown is a block diagram of an alternative embodiment of the present invention. In this embodiment, an optical input signal 200 travels into a substrate region 201, near an optically resonant system 202. The optically resonant system 202 captures a portion of the signal and generates an optical output signal 204. By way of example, the optical output signal could be emitted in a direction orthogonal to the optical input signal 200.

The optically resonant system works by capturing the evanescent fields 203 associated with the optical input signal 200 in the optically resonant system 202. Evanescent fields are created when a signal is propagating in a waveguide. The optical input signal, due to its electromagnetic nature, inherently develops an evanescent field surrounding the waveguide. The evanescent field 203 created proximate to the optically resonant system by the optical input signal 200 resonates with at least one mode of the optically resonant system 202, causing optical energy to be transferred into the optically resonant system 202. The optically resonant system 202 then preferentially emits the optical energy in a desired direction to producing the optical output signal 204. The optical output signal 204 created by the optically resonant system 202 may be attenuated, but typically retains any "information content" that may have been encoded on the input signal 200. The output signal 204 in one embodiment, among others, has an axially symmetric radiation pattern that is ideal for coupling the optical output signal into an optical fiber, or into another integrated optical device.

Figure 3:
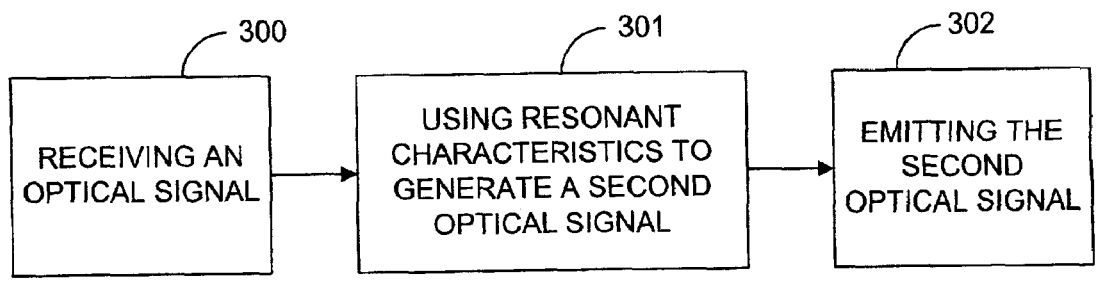
FIG. 3 is a flowchart illustrating a method for using the optically resonant system of FIG. 2.

Referring now to FIG. 3, shown is an embodiment of a method of using the optically resonant system of FIG. 2. At block 300, the optically resonant system receives an optical signal. In block 301, resonant characteristics are used to generate a second optical signal. Then, in block 302, the second signal is emitted.

As an example, the optically resonant system typically receives an optical signal through a waveguide. This waveguide can terminate in the optically resonant system, or alternatively, the waveguide can continue through the optically resonant system. In either case, the evanescent fields which extend outside the waveguide allow coupling of the optical signal to the optically resonant system. An asymmetrical containment profile of the optically resonant system can allow the optically resonant system to preferentially emit the second optical signal. The emitted optical signal can then be coupled to another integrated optical device or simply an optical fiber to transport the emitted optical signal to another location.

Figure 4:
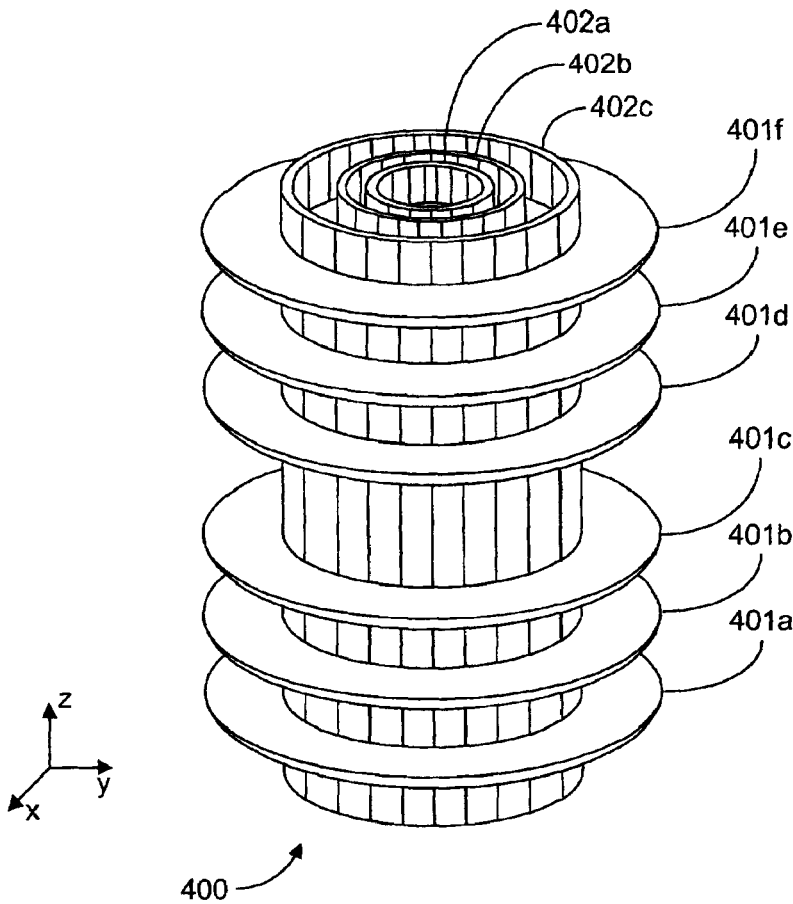
FIG. 4 is a schematic diagram of an embodiment of an optically resonant system of the present invention.

Referring now to FIG. 4, shown is a schematic diagram of an embodiment of the optically resonant system. The present embodiment of the optically resonant system, shown in free space, includes a dielectric structure 400. The dielectric structure 400 involves a first structure of dielectric parallel plates 401a–f, and a second resonant system overlaps, and is in optical communication with, the second structure of the optically resonant system to capture at least a portion of an optical input signal. The first and second structures then operate to emit an output signal. By way of example, the optical output signal can be emitted in a direction orthogonal to the optical input signal.

Figure 5:
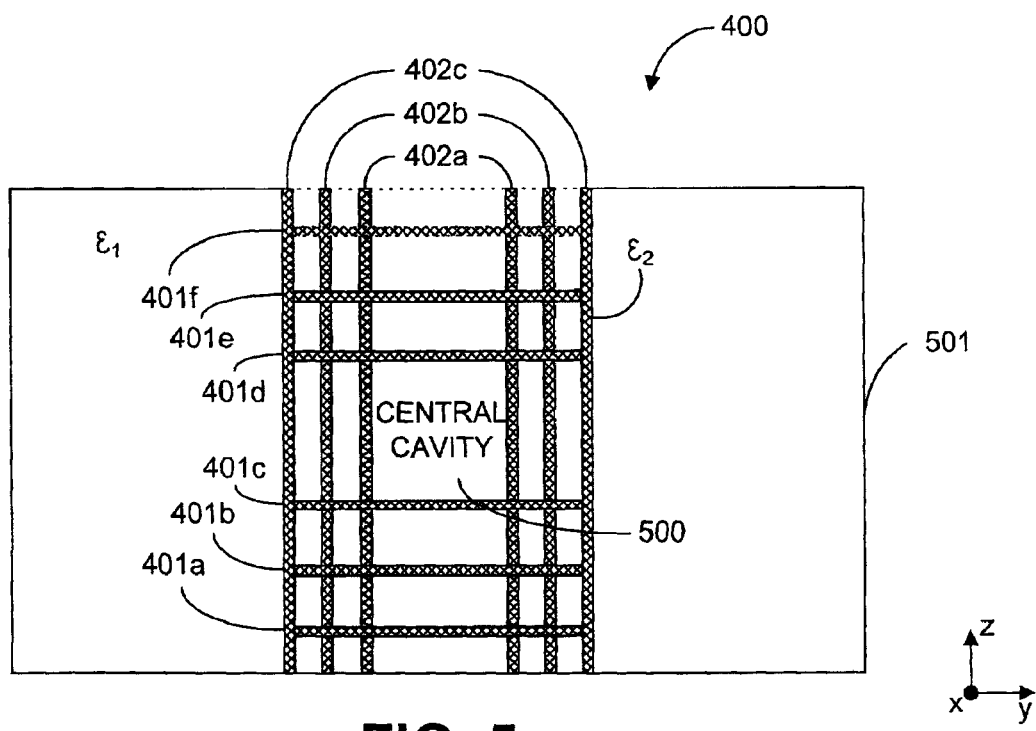
FIG. 5 is a cross-sectional view of the optically resonant system of FIG. 2, showing the resonant cavity formed in an optical substrate.

Referring now to FIG. 5, shown is a cross-sectional view of one embodiment, among others, of the optically resonant system of the present invention. The optically resonant system 400 includes a plurality of plates 401a–f and a plurality of cylinders 402a–c which intersect with each other to form a central cavity 500 with resonant characteristics. Each of the plates 401a–f resides in the x-y plane, and partially reflects optical energy along the z-axis, orthogonal to the x-y plane. Each of the cylinders 402a–c partially reflects light in the radial direction, parallel to the x-y plane. Typically, the plates 401a–f and cylinders 402a–c are formed from the same dielectric material or similar dielectric materials. For example, one such dielectric material that could be used is silicon dioxide. A surrounding material, or optical substrate 501, is typically formed from a dielectric material having a lower dielectric constant than the material which forms the plates 401a–f and cylinders 402a–c. In an exemplary embodiment, a typical dielectric constant for the plates and cylinders could be about 11, and a typical dielectric constant for the surrounding material could be about 2. However, one skilled in the art will recognize that many different pairs of dielectric constants can operate to form the optically resonant system and the invention is not limited to merely the dielectric constants disclosed. When the plates 401a–f and cylinders 402a–c are combined as in FIG. 5, the plates 401a–f and cylinders 402a–c operate to capture certain wavelengths of light. These wavelengths of light are captured according to the dimensions and materials of the optically resonant system 400, as will be fully described in detail below.

The optically resonant system 400, shown formed in an optical substrate 501, can generally be described as an out-of-plane coupler used to redirect an optical signal, and more specifically as a three dimensional distributed Bragg reflector. In general terms, the optically resonant system 400 captures light through the resonant characteristics of the system. The characteristics of the optically resonant system are defined according to the dimensions of the system and refraction properties of the dielectric materials comprising the system.

In the embodiment shown in FIG. 5, the optically resonant system 400 has a symmetrical radiation pattern, radiating captured optical energy substantially in all directions. This radiation pattern can be altered by modifying structure of the optically resonant system 400. This modification of the optically resonant structure can be achieved by modifying the fabrication of the optically resonant system 400 or by modifying the optically resonant system 400 after fabrication. First will be discussed an asymmetric stricture which can radiate, preferentially, in one direction, then will be discussed a symmetric structure which can radiate, preferentially, in two directions.

A fabricator can alter the radiation pattern of the optically resonant system 400 by forming an asymmetric structure that radiates, preferentially, optical energy through the asymmetry of the optically resonant system 400. Such an asymmetrical structure could be accomplished by building the optically resonant system 400 with an asymmetrical structure. In other words, during the fabrication of the optically resonant system 400, at least one of the plates 401a–f or cylinders 402a–c, or a portion thereof, could be left out to cause the optically resonant system 400 to radiate, preferentially. It should be appreciated by one of ordinary skill in the art that such an asymmetrical structure could also be accomplished by removing a plate 401 or a cylinder 402, or a portion of a plate 401 or cylinder 402, from the optically resonant system 400 after fabrication.

The optically resonant system 400 of the invention can also be used as an out-of-plane coupler such as by structuring the optically resonant system as an axially symmetric resonant structure and embedding the optically resonant system 400 in an integrated optical device, as illustrated in FIG. 5. Inducing the optically resonant system 400 formed in an optical substrate to emit radiation out of the substrate surface, in one embodiment, is achieved by using fewer pairs of plates relative to the number of cylinders in the optically resonant system 400. The optically resonant system has a relatively high Q-factor, and couples to a plurality of evanescent fields extending outside the core of a proximal planar waveguide. The optically resonant system 400 is further structured to emit optical radiation in a direction orthogonal to the proximal planar waveguide. The resonant coupling between the proximal planar waveguide and the central cavity can be matched by appropriate design and relative placement of the two components, as will be described in detail below. The number of periods of reflectors (plates 401a–f and cylinders 402a–c) of the optically resonant system, in all dimensions, is chosen to achieve adequate coupling between the optically resonant system 400 and the proximal planar waveguide. The number of periods of reflectors of the optically resonant system can be further chosen to cause radiation out of the plane to be the dominant energy loss mechanism for the optically resonant system 400.

Using a structure in which the containment characteristics are asymmetrical for extracting energy from a planar waveguide has the advantage of emitting an out-of-plane signal from a single resonant mode, with an axially symmetric radiation pattern reflective of the radial symmetry of the resonant mode.

Figure 6:
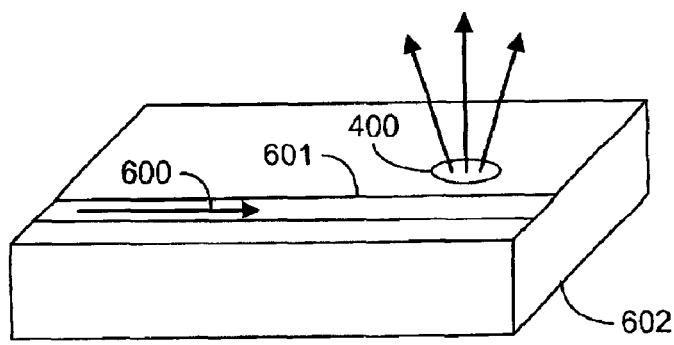
FIG. 6 is a schematic diagram illustrating a first functionality of the optically resonant system of FIG. 5.

Referring now to FIG. 6, shown is a schematic diagram illustrating a first functionality of the optically resonant system of FIG. 5. A physical process useful in order to understand the basic operation of the optically resonant system 400 is the mechanism by which an optical input signal 600 is coupled into the optically resonant system 400 from a nearby waveguide 601 in an optical substrate 602. Typical geometries arc shown in FIGS. 6 and 7, where the waveguide modes can be either travelling or standing waves.

FIG. 6 illustrates an embodiment in which the optical input signal 600 is coupled into the optically resonant system 400 through evanescent fields surrounding the waveguide 601. These evanescent fields excite the modes of the resonant cavity of the optically resonant system 400 and transfer optical energy within the optically resonant system 400 from the waveguide 601. The optically resonant system 400 then radiates the optical energy from the surface of the substrate to form a second signal.

Figure 7:
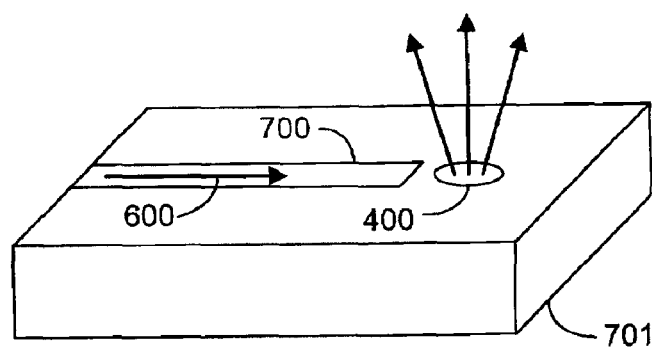
FIG. 7 is a schematic diagram illustrating alternative functionality of the optically resonant system of FIG. 5.

FIG. 7 illustrates an embodiment whereby the optical input signal 600 forms a standing wave that couples energy to the optically resonant system 400 via the evanescent fields surrounding waveguide 700 in substrate 701. The optically resonant system 400 through the resonant properties of the system captures optical energy of the optical input signal 600 and uses the optical energy to create an optical output signal. The optically resonant system 400 then emits the second optical signal through the substrate surface. It is assumed for each of these geometries that the waveguide modes are spatially normalizable, and have the bulk of their energy confined to the core of the waveguides 601 and 700, with calculable evanescent fields outside the core.

Figure 8:
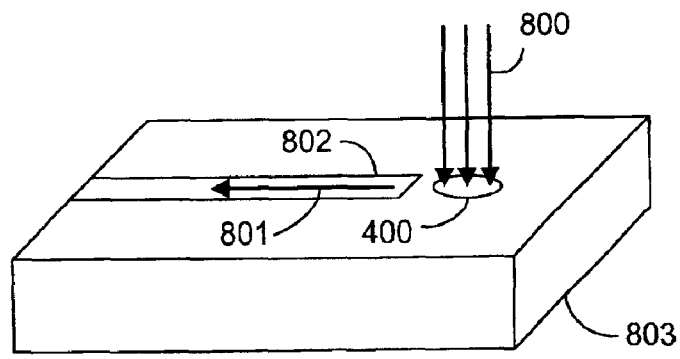
FIG. 8 is a schematic diagram illustrating alternative functionality of the optically resonant system of FIG. 5.

Referring now to FIG. 8, due to the reciprocity principle applicable to the passive nature of the optically resonant system 400, the system can also be used to couple energy into a waveguide of an integrated optical device from optical sources above the substrate surface. Here an optical input signal 800 is directed into the optically resonant system 400. The optically resonant system 400 then captures energy from the optical input signal and generates an optical output signal 801 and directs the optical output signal 801 into the waveguide 802 formed in the substrate 803. The optically resonant system in this embodiment could have an asymmetric containment characteristic that radiates substantially into the waveguide 802. As one skilled in the art will recognize this can be accomplished by forming the optically resonant system 400 with an asymmetrical structure in the radial direction.

Figure 9:
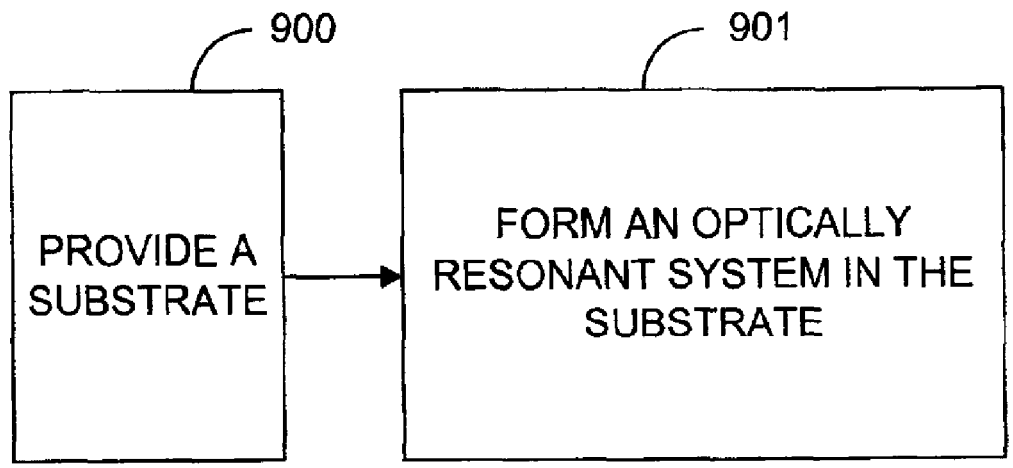
FIG. 9 is a flowchart illustrating a method for making the optically resonant system of FIG. 5.

Referring now to FIG. 9, shown is a flowchart illustrating a method for making the optically resonant system of FIG. 5. The first step 900, is to provide a substrate. After the substrate is provided, the next step 901 is to form a resonant cavity. Step 901 has been compressed in this process, but typically includes a series of fill and backfill steps marked by intermediate photolithography steps, as known to those skilled in the art. In order to fabricate the optically resonant system 400, the user can also fabricate a waveguide during step 901 of the present method for making the optically resonant system 400.

These etch and backfill steps typically could include using a layer by layer approach to fabricating the optically resonant system. As first step to the layer by layer approach mentioned above, a fabricator could etch at least one ring into an optical substrate formed from a first material, such as silicon dioxide. Next the fabricator could fill the ring(s) and deposit a plate with a second material, such as silicon. Then, the fabricator could deposit the first material over the plate, and repeat this process until a desired number of cylinders and plates have been fabricated.

Alternatively, the fabricator could first deposit a layer of the second material over the substrate. The fabricator could then etch the second material layer to form at least one ring over the substrate. Next, the fabricator could deposit a layer of the substrate first material to fill in the gaps in the ring layer. The fabricator could then deposit a plate layer of the second material, etch the plate, and fill in the gaps in the plate layer. Then the fabricator could repeat each these steps until a desired number of cylinders and plates have been formed. These fabrication methods are merely examples of fabrication methods that may be used, however, one skilled in the art will recognize that there exist numerous different methods to fabricate a given structure.

One skilled in the art will further recognize that the number of plates and cylinders defines a containment strength of the optically resonant system. The containment strength defines the ability of the optically resonant system 400 to keep a resonant signal contained within the optically resonant system after capturing the resonant signal. This containment strength can be increased or decreased according to the number of plates or cylinders that are included in the optically resonant system, as to will be discussed below. Thus, the number of plates or cylinders can be adjusted to compensate for specific design considerations of each application. Furthermore, one skilled in the art will recognize that the fabricator can etch a completed optically resonant system 400 in order to adjust the optical power radiated from the resonant cavity.

Figure 10:
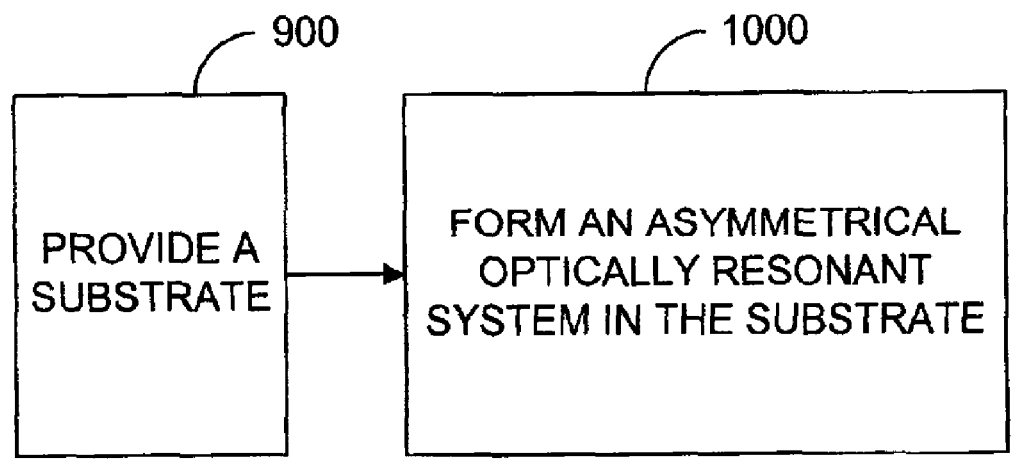
FIG. 10 is a flowchart illustrating an alternative method for making the optically resonant system of FIG. 5.

Referring now to FIG. 10, shown is a flowchart illustrating an alternative method for making the optically resonant system of FIG. 5. The first step is the same as the prior embodiment, shown in FIG. 9. However, the second step 1000 is different. Step 1000 allows the user to form an optically resonant system having an asymmetrical structure. Instead of forming a completely symmetrical structure, at least a portion of one or more of the outer plates or cylinders are left out during fabrication. Thus, an asymmetric optically resonant system is formed which will radiate, preferentially, toward the asymmetry in the structure.

Referring now to FIG. 1, shown is an illustration demonstrating the operation of the optically resonant system of FIG. 5. The first structure 1100, includes a plurality of parallel plates 401a–f. These plates 401a–f lie in the x-y plane, and partially reflect optical energy in the direction of the z-axis, orthogonal to the x-y plane. Thus the first structure can be called a one-dimensional (1-D) reflector. The second structure 1101, includes a plurality of concentric cylinders 402a–c. The cylinders 402a–c partially reflect optical radiation radially from the cylinders 402a–c. Thus the second structure can be called a two-dimensional (2-D) reflector.

The first and second structures 1000, 1101 can work together without disrupting the coherent behavior of one another. This is best observed when a wave equation describing the azimuthal electric field for a Transverse Electric (TE) mode of the combined structure is written down $$\nabla^2 E_{100}(\rho,z) + k_o^2 \in_{19S}(\rho,z) E_\phi(\rho,z) = 0 \qquad (1)$$

where $k_o$ is the free space k-vector for the specified frequency, $\rho$ is a radial distance (in the x-y plane), z is a distance along axis orthogonal to the radial axis, $E_\phi(\rho,z)$ is an electric field in polar coordinates, and $\in_\perp(\rho,z)$ is the relative dielectric constant of the material of the first and second structures 1100, 1101, which are assumed to be the same. The relative dielectric constant, $\in_\perp(\rho,z)$, is given by $$\in_\perp(\rho,z) = 1 + (\in_\perp' - 1)(f_1(\rho) + f_2(z) - f_1(\rho)f_2(z)) \qquad (2)$$

where $$f_1(\rho) = \begin{cases} 1 & \text{inside cylinder} \\ 0 & \text{outside cylinder} \end{cases} \qquad (3)$$

$$f_2(z) = \begin{cases} 1 & \text{inside plate} \\ 0 & \text{outside plate} \end{cases}$$

and $\in_\perp'$, is the constant value of the dielectric constant of the first and second structures 1100, 1101. Note that Equation (1) would be completely separable except for the last term in Equation (2) describing the dielectric constant of the combined first and second structures. This term, proportional to $f_1(\rho)f_2(z)$, is required so that the dielectric constant value is not double-counted in the regions of intersection of the plates and cylinders 401a–f, 402a–c. If Equation (1) is not separable between the $\rho$ and z dimensions, then the set of plates 401a–f comprising the 1-D reflectors and the set of cylinders 402a–c comprising the 2-D reflectors do not act independently. Thus, the 1-D and 2-D reflectors could not be simply combined to create a 3-D confining structure.

For an appropriate mode choice, separability could be restored to an extremely high level of accuracy. This mode choice is the $TE_0$ resonant mode, which has electric field nulls at the inner surfaces of all plates and cylinders 401a–f, 402a–c, when following coherent design rules for the optically resonant system 400. Separability is restored when the electric field values experience a "double-null" (from the $\rho$ and z dimensions) at non-separable regions of intersection between the plates and cylinders 401a–f, 402a–c of the optically resonant system 400. Thus, the non-separable term can be deleted from the equation. The numerical error associated with this approximation can be shown to be extremely small using perturbative techniques.

The above equations, however, calculate for an optically resonant system in free space, as in FIG. 4. To calculate the relevant resonant modes of the optically resonant system 400 of FIG. 5, we restrict to the $TE_0$ mode, and the equation for magnetic field, $\vec{B}$, is derived from Maxwell's equations $$\nabla^2 \vec{B}(\rho,z)+k_o{}^2 \in_\perp (\rho,z)\vec{B}(\rho,z) = i\, k_o/C(\vec{\nabla}_\in \times \vec{E}) \qquad (4)$$

where c is the free-space velocity of light, i is the square root of negative one (−1), and the other terms are as defined previously. The inhomogeneous term on the right hand side of Equation (4) exists to ensure the appropriate boundary conditions for fields at the interfaces between regions of different dielectric constant. This inhomogeneous term is ignored as long as the boundary conditions are matched across each interface between homogeneous regions. For the $TE_0$ modes, attention is restricted to the equation for $B_z$ $$\nabla^2 B_z(\rho,z)+k_o{}^2 \in_\perp (\rho,z) B_z(\rho,z)=0 \qquad (5)$$

and the other fields will be determined from this field using Maxwell's equations. As described previously, if the non-separable term in the expression for $\in_\perp$ as given by Equation (2) is ignored, Equation (5) becomes completely separable, and $B_z$ can be rewritten as $$B_z(\rho,z) \to R(\rho)Z(z). \qquad (6)$$

The partial differential equation can be written as two ordinary differential equations $$\left(\frac{1}{\rho}\frac{d}{d\rho}\left(\rho\frac{d}{d\rho}\right) + k_o^2(\varepsilon_1 + (\varepsilon_2 - \varepsilon_1)f_1(\rho)) - \Lambda\right)R(\rho) = 0 \qquad (7)$$

$$\left(\frac{d^2}{dz^2} + k_o^2(\varepsilon_2 - \varepsilon_1)f_2(z) + \Lambda\right)Z(z) = 0 \qquad (8)$$

where $\in_z(\in_1)$ is the higher (lower) dielectric constant of the structure 400, and $\Lambda$ is the separation constant. The separation constant is a mathematical term for a constant that must be included in both ordinary differential equations in order to for the single partial differential equation to be separable. The solutions in each homogeneous region have the form $$R(\rho)=CJ_0(\gamma_\rho \rho)+DY_0(\gamma_\rho \rho) \qquad (9)$$

$$Z(z)=A\cos(\gamma_z z)+B\sin(\gamma_z z) \qquad (10)$$

$\gamma_\rho$ and $y_z$ being commonly described as the propagation vector in the $\rho$ and z directions, respectively, inside of the central cavity, where $$\gamma_\rho = (k_o{}^2(\in_1 + (\in_2 - \in_1)f_1(\rho)) - \Lambda)^{1/2} \qquad (11)$$

and $$\gamma_z = (k_o{}^2(\in_2 - \in_1)f_2(z) + \Lambda)^{1/2}. \qquad (12)$$

For the $TE_0$ modes, the non-zero fields as given by the Maxwell curl equations are $$B_z(\rho,z)=R(\rho)Z(z)+\Lambda)^{1/2}. \qquad (13)$$

$$E_\phi(\rho,z) = -\frac{ick_o}{\gamma_\rho^2}R'(\rho)Z(z) \qquad (14)$$

$$B_\rho(\rho,z) = \frac{1}{\gamma_\rho^2}R'(\rho)Z'(z) \qquad (15)$$

where the prime denotes differentiation with respect to the appropriate argument.

Figure 13:
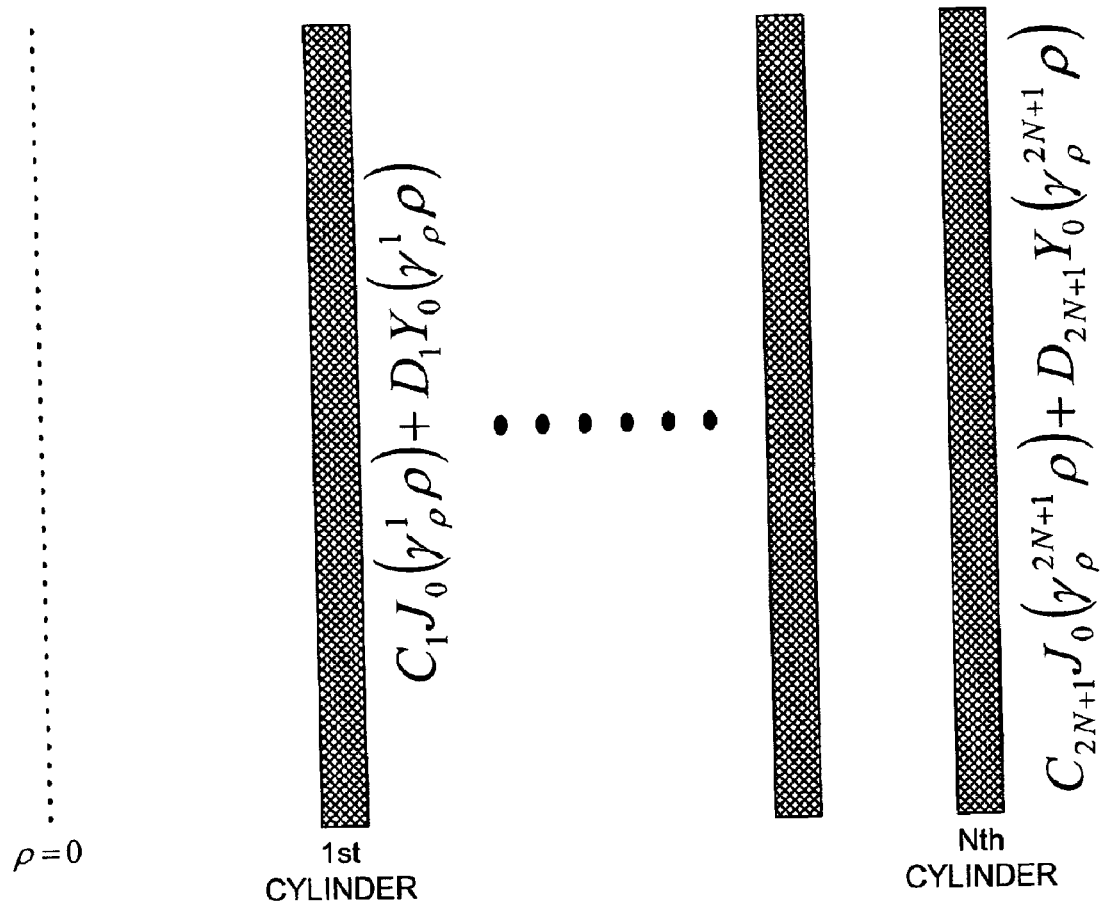
FIG. 13 is a block diagram illustrating the structure and waveforms that were used to solve for the $\rho$-dimensional (radial) dependence of the optically resonant system shown in FIG. 5.

In order to find a complete solution for a given structure and frequency, constants A, B, C and D will be determined for each homogeneous region of the optically resonant system 400, and the separation constant, $\Lambda$, calculated. This is done by matching boundary conditions at each interface, and using the asymptotic conditions of the unbounded radial region. To explicitly solve for the function $Z(z)$, the continuity of $E_\phi$, $B_z$ and $B_\rho$ is imposed at each interface of the optically resonant system high-index/low-index plate regions as shown in FIG. 13, yielding 2×2 matrix equations connecting the coefficients in each separate region $$\begin{pmatrix} A_{i+1} \\ B_{i+1} \end{pmatrix} = [M]\begin{pmatrix} A_i \\ B_i \end{pmatrix}. \qquad (16)$$

Restricting to a lowest resonant (spatially even) solution, and imposing the fact that the E-field is zero at an upper surface of the optically resonant system, a transcendental equation is derived for the separation constant, $\Lambda$ $$\gamma_z^{2N+1} = -\frac{2}{H}\alpha\tan\left(\frac{M_{11}}{M_{21}}\right) \qquad (17)$$

where H is the height of the optically resonant system 400. The separation constant, $\Lambda$, is determined from Equations (12) and (17) numerically, and subsequently all of the coefficients $A_i$ and $B_i$ are determined by matrix concatenation.

Figure 14:
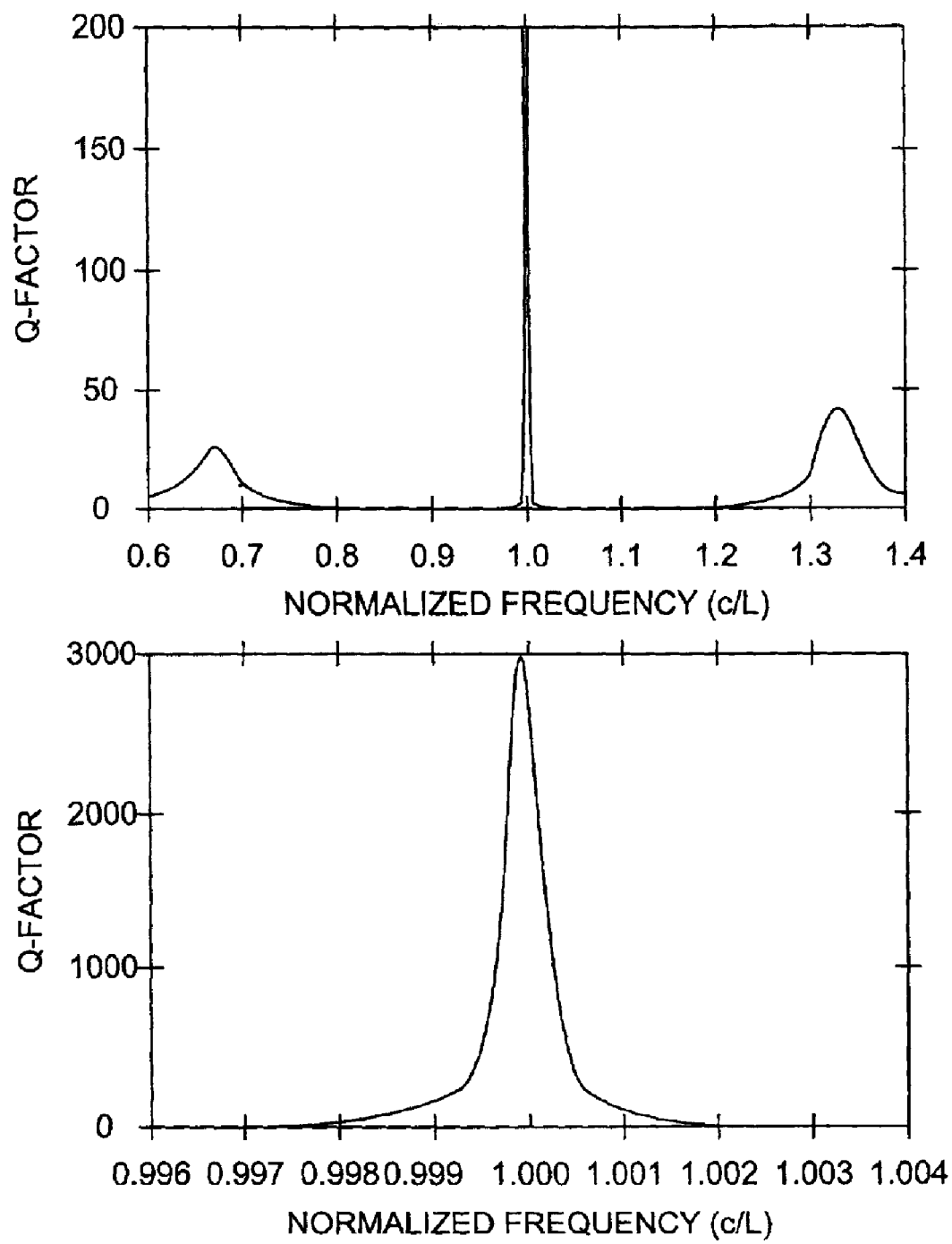
FIG. 14 is a graph illustrating the quality factor (Q) of an optical signal produced by the optically resonant system of FIG. 5, versus the normalized frequency of an optical wave.

Explicit solution for the function $R(\rho)$ is similarly computed, in that field continuity is enforced at each dielectric region interface, as shown in FIG. 14, and the coefficients of each region are connected to those of the other regions by 2×2 matrix concatenation. In order to solve for the regions, some physical boundary condition must be imposed. The physical boundary condition imposed is that there is an incoming cylindrical traveling wave incident upon the structure, and an outgoing cylindrical wave leaving the structure. Conservation of energy demands that the incoming and outgoing waves have equal magnitudes, but may differ by a phase shift, $\delta$, so that $$[C_{2N+1}J_o(\gamma_\rho^{2N+1}\rho)+D_{2N+1}Y_o(\gamma_\rho^{2N+1}\rho)] \qquad (18)$$

is replaced by $$\frac{1}{2}[(J_o(\gamma_\rho^{2N+1}\rho) + iY_o(\gamma_\rho^{2N+1}\rho)) + e^{i\delta}(J_o(\gamma_\rho^{2N+1}\rho) - iY_o(\gamma_\rho^{2N+1}\rho))]. \qquad (19)$$

The equation determining the phase shift is a result of demanding that the fields remain finite at the origin, $\rho=0$. The field in the central cavity 500 can be connected to those in an outer region using the 2×2 transfer matrices, determined from matching fields at the interfaces, $$\begin{pmatrix} C_1 \\ D_1 \end{pmatrix} = [M]\begin{pmatrix} \cos(\delta/2) \\ \sin(\delta/2) \end{pmatrix}. \qquad (20)$$

In order for the fields to be finite at the origin, $D_1$ is zero, since the Y-functions are singular for a zero argument. Therefore, the equation for the phase shift is $$\delta = -2\arctan\left(\frac{M_{21}}{M_{22}}\right). \qquad (21)$$

The full solution, and all coefficients, are calculated by matrix concatenation.

To summarize, using the above described techniques, the full solution is found for an incident cylindrical wave radiating from the optically resonant system 400. An operating frequency at which the invention is designed to operate is specified, then a separation constant and $\gamma_z$ are determined, giving $\gamma_\rho$. From this, a phase shift, $\delta$, is determined, and all expansion coefficients in all regions can be specified.

Figure 15:
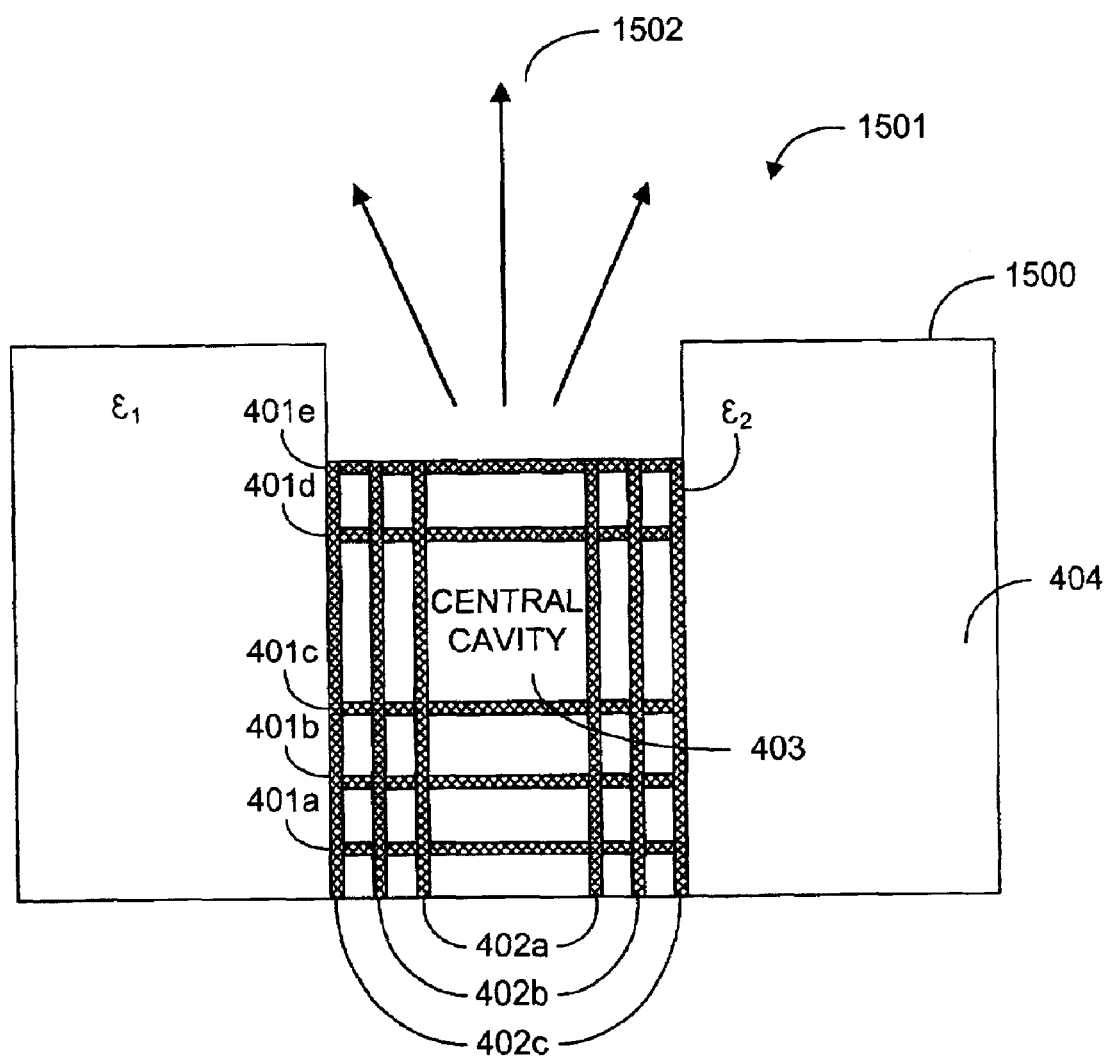
FIG. 15 is a cross-sectional view of the optically resonant system of FIG. 5, without a top plate of the optically resonant system.

Referring now to FIG. 15, the resonant modes of the optically resonant system 400 are determined by calculating scattering solutions for a range of frequencies, and computing the Q-factor of the mode for each frequency, as defined by $$Q = \omega \frac{\text{stored energy}}{\text{incident power}} \qquad (22)$$

where $\omega$ is the radiation angular frequency, and stored energy and incident power are computed from calculated field distributions in the usual way. A plot of Q versus $\omega$ displays a number of broad peaks where energy is preferentially stored in the structure, i.e. weak resonances, and a single peak of very high Q corresponding to the $TE_0$ mode where all plates and cylinders 401*a–f*, 402*a–c* are acting coherently to efficiently trap light radiation. FIG. 15 shows a plot for a typical optically resonant system including four cylinder regions, four plate pair regions, and dielectric constants of 11.56 and 2.25 for the optically resonant system and background regions, respectively. Note the extremely high Q of the $TE_0$ mode, indicating the efficiency of the optically resonant system created using design rules discussed herein.

The analysis technique used to determine the coupling of the waveguide structure 601 (FIG. 6) and the optically resonant system 400 is a version of coupled mode theory. The first step is to write down the dynamical equations for the electromagnetic fields as derived from Maxwell's equations $$\nabla^2 \vec{E} - \frac{\varepsilon_r}{c^2} \ddot{\vec{E}} + \vec{\nabla}\left(\frac{1}{\varepsilon_r}(\vec{\nabla}\varepsilon_r) \cdot \vec{E}\right) = 0 \qquad (23)$$

$$\nabla^2 \vec{H} - \frac{\varepsilon_r}{c^2} \ddot{\vec{H}} + \varepsilon_o(\vec{\nabla}\varepsilon_r) \times \vec{E} = 0 \qquad (24)$$

where a "dot" above a field denotes a time derivative, $\in_o$ is the free-space permittivity, and $\in_r$ is the relative permittivity of the ponderable media. Note, as before, that the inhomogeneous terms in the above wave equations are terms that have the sole purpose of ensuring proper boundary conditions between regions of different dielectric constant.

It is assumed that unperturbed fields of an isolated optically resonant system 400 are known, and the electric field is specified by $\vec{E}_D$. Similarly, it is assumed that the unperturbed fields of an isolated waveguide 601 are also known, with electric field specified by $\vec{E}w$. The relative dielectric constant of the isolated waveguide 601 is given by $\in_w(\vec{x}) = \in_s + \tilde{\in}_w(\vec{x})$, where $\in_s$ corresponds to the substrate value, and $\tilde{\in}_w(\vec{x})$ corresponds to the deviation of the isolated waveguide 601 from the substrate value. Similarly, the relative dielectric constant of the isolated optically resonant system 400 is given by $\in_D(\vec{x}) = \in_s + \tilde{\in}_D$) where $\tilde{\in}_D(\vec{x})$ corresponds to the deviation of the isolated optically resonant system 400 from the substrate value. Accordingly, these fields satisfy $$\nabla^2 \vec{E}_w - \varepsilon_w k_o^2 \ddot{\vec{E}}_w + \vec{\nabla}\left(\frac{1}{\varepsilon_w}(\vec{\nabla}\varepsilon_w) \cdot \vec{E}_w\right) = 0 \qquad (25)$$

$$\nabla^2 \vec{E}_D - \varepsilon_D k_o^2 \ddot{\vec{E}}_D + \vec{\nabla}\left(\frac{1}{\varepsilon_D}(\vec{\nabla}\varepsilon_D) \cdot \vec{E}_D\right) = 0. \qquad (26)$$

The approximate coupled mode solution to a composite system including both the isolated optically resonant system 400 and the isolated waveguide 601 is defined in terms of the unperturbed fields $$\vec{E} = A(t)\vec{E}_w + B(t)\vec{E}_D \qquad (27)$$

where $A(t)$ and $B(t)$ are time-dependent coefficients specifying how the energy is shared between the two structures as a function of time. Plugging the solution ansatz of a Equation (27) into dynamical Equation (23), using the unperturbed field equations, and approximations that $|\ddot{A}| \ll |\omega \dot{A}|$, $|\ddot{B}| \ll |\omega \dot{B}|$, and the inhomogeneous boundary terms are to be ignored in a perturbative treatment, yields $$\frac{\omega^2}{c^2}\tilde{\varepsilon}_D A \vec{E}_w + \frac{2i\omega}{c^2}(\varepsilon_S + \tilde{\varepsilon}_w) \dot{A} \vec{E}_w + \qquad (28)$$
$$\frac{\omega^2}{c^2}\tilde{\varepsilon}_w B \vec{E}_D + \frac{2i\omega}{c^2}(\varepsilon_S + \tilde{\varepsilon}_D) \dot{B} \vec{E}_D = 0.$$

In order to get scalar differential equations for time-dependent expansion coefficients, Equations (28) can be multiplied by one of the unperturbed fields and integrated over all space. However, in order to simplify this process, one can first introduce the notation $$\langle W | \varepsilon_i | D \rangle = \int \vec{E}_w^* \cdot \vec{E}_D \varepsilon_i(x) d^3 x \qquad (29)$$

and catalogue the hierarchy of magnitudes of overlap integrals, $$\langle W | \varepsilon_w | W \rangle \sim 1 \qquad (30)$$

$$\langle W | \tilde{\varepsilon}_w | D \rangle \sim \eta \qquad (31)$$

$$\langle D | \tilde{\varepsilon}_w | D \rangle \sim \eta^2 \qquad (32)$$

where $\eta$ is a small parameter which characterizes the magnitude of the overlap between the evanescent fields and the perturbing structures. Using this notation, and keeping only the lowest order terms in $\eta$, multiplication of Equation (28) by $\vec{E}_w$ and integrating over all space yields $$\dot{A} - i\gamma_1 B = 0 \qquad (33)$$

where $$\gamma_1 = \frac{\omega}{2} \frac{\langle W | \tilde{\varepsilon}_w | D \rangle}{\langle W | \varepsilon_w | W \rangle}. \qquad (34)$$

Similarly, multiplication of Equation (28) by $\vec{E}_D$ and integrating over all space yields $$\dot{B} - i\gamma_2 A = 0 \qquad (35)$$

where $$\gamma_2 = \frac{\omega}{2} \frac{\langle D | \tilde{\varepsilon}_D | W \rangle}{\langle D | \varepsilon_D | D \rangle}. \qquad (36)$$

The solutions to Equations (33) and (35) have the form $$A(t) \sim e^{\pm i\Gamma t} \text{ and } B(t) \sim e^{\pm i\Gamma t} \tag{37}$$

where $$\Gamma^2 = \gamma_1 \gamma_2 = \frac{\omega^2}{4} \frac{\langle W|\bar{\varepsilon}_W|D\rangle\langle D|\bar{\varepsilon}_D|W\rangle}{\langle W|\varepsilon_w|W\rangle\langle D|\varepsilon_D|D\rangle}. \tag{38}$$

The "coupling rate," $\Gamma$, is easily calculable from the expressions for the unperturbed fields, optically resonant system 400 and waveguide 601 as previously described. Clearly, the rate of transfer of energy between the waveguide and the optically resonant system increases as the waveguide 601 and optically resonant system 400 are brought closer together, and have larger evanescent field overlaps.

The Equations (33) and (35) can be generalized to include two possible additional physical processes. Specifically, Equation (35) can include the effects of the energy radiated from the optically resonant system 400

$$\dot{B}i\gamma_2 A + \gamma_D B = 0 \tag{39}$$

where $\gamma_D = \omega/(2Q)$ and Q is the radiation-Q. Additionally, Equation (33) can be generalized to include the effect of a gain term acting on the waveguide mode $$\dot{A} - i\gamma_1 B + \gamma_w A = 0 \tag{40}$$

where $\gamma_w$ is the coefficient of exponential gain typically associated with an active gain medium. Solution of these equations is completed as before, with the general result $$A(t) \sim e^{ig_\pm t} \text{ and } B(t) \sim e^{ig_\pm t} \tag{41}$$

where $$g_\pm = \frac{i(\gamma_D - \gamma_w) \pm \sqrt{4\Gamma^2 - (\gamma_D - \gamma_w)^2}}{2}. \tag{42}$$

To best understand the usefulness of this result, a practical example is analyzed. This example assumes that there is a fixed amount of energy in the waveguide 601, which will leak out through the optically resonant system 400 as optical energy. It is further assumed that the waveguide has no gain ($\gamma_w = 0$), and the only means of energy loss from the waveguide 601 is through coupling to the optically resonant system 400. For this case, the coupling constant term given in Equation (42) becomes $$g_\pm = \frac{i\gamma_D \pm \sqrt{4\Gamma^2 - \gamma_D^2}}{2}. \tag{43}$$

The boundary conditions for the coefficients of the waveguide 601 and optically resonant system 400 have the form $A(t=0)=1$ and $B(t=0)=0$, respectively. Simple algebra yields the particular solution $$A(t) = \frac{g_-}{g_- - g_+} e^{ig_+ t} - \frac{g_-}{g_- - g_+} e^{ig_- t} \tag{44}$$

$$B(t) = -\frac{\gamma_2}{g_- - g_+} e^{ig_- t} + \frac{\gamma_2}{g_- - g_+} e^{ig_- t}. \tag{45}$$

The physical content of these solutions is best illustrated by investigating them in two different physical limits. In the first limit of very strong coupling between the waveguide and the high-Q embedded DBR resonator, with $\Gamma \gg \gamma_D$, $$A(t) \sim B(t) \sim e^{-\frac{\gamma_D}{2}t} \tag{46}$$

and all fields decay at a rate governed by the radiation Q of the optically resonant system 400, as expected. In the second limit of very weak coupling between the waveguide 601 and the optically resonant system 400, with $\gamma_D \gg \Gamma$, $$A(t) \sim B(t) \sim e^{-\frac{\Gamma^2}{\gamma_D}t} \tag{47}$$

and all fields decay at a rate governed by the coupling strength.

With these simple expressions, all aspects of the coupling between an optically resonant system 400 and a optical waveguide 601 can be computed for a given set of unperturbed fields. This should be sufficient for typical design requirements.

The optically resonant system 400 structures can be used in any application where it is desired to extract optical energy from a substrate surface. Optical energy can be coupled from virtually any integrated optical device to the optically resonant system 400 through evanescent fields, and ultimately directed out of the substrate surface in the form of optical energy. These integrated optic structures can range from waveguides to resonant structures, and the coupling to the optically resonant system can be accurately controllable in a calculable way, as shown in the foregoing discussion. The optical energy radiated out of the substrate surface can be directed to other devices or detectors via free-space transmission, or efficiently collected by an optical fiber. The radiated optical energy is ideally suited for coupling into an optical fiber, since the output beam has a circular symmetry and a beam diameter on the order of the output wavelength. Additionally, multiple optically resonant systems 400 can be fabricated on a single integrated optic device. Due to the wavelength specific nature of these optically resonant systems 400, it is possible to have all of the couplers operating at the same wavelength, or a series of wavelengths. In all of these applications, the fabrication steps involved in producing an optically resonant system 400 are compatible with the standard growth procedures of typical integrated optic devices. The two-material structures can be grown by a process of selective etching and back-filling during the fabrication of the associated integrated optics device. The design rules of the present invention will now be discussed. The practical design rules of the optically resonant system 400 begin with specification of the desired resonant frequency, $\omega$, and the z-height of the resonant optical cavity 500, L, as the only required inputs (assuming the two dielectric constants, $\in_1$ and $\in_2$ are given as a constraint of the materials system under consideration). While the desired frequency is usually set by the requirements of the application, the resonant optical cavity 500 height can be adjusted to give a desirable aspect ratio for the dimensions of the resonant optical cavity 500. Obtaining a desirable aspect ratio typically includes shortening the height of the resonant optical cavity 500 with respect to the radius of the resonant optical cavity 500. This shortening results in more radiation leaking is from the resonant optical cavity 500 along the z-axis of the optically resonant system.

The first intermediate parameters to define are the k-vector components, $k_{zi}$ and $k_{\rho i}$, of a resonant mode for the different dielectric regions specified by $\in_1$ and $\in_2$. If the z-height of the resonant optical cavity 500 is L, the resonance condition is that a mode undergoes a phase shift of an integral multiple of $2\pi$ for a round trip along the z-axis, i.e. $2Lk_{zi}=2n\pi$, where n is the order of a mode of the system. For the lowest order mode $$k_{zl} = \frac{\pi}{L}. \quad (48)$$

The other k-vector components are determined using the defining relation from the wave equation, $\in k_o^2 = k_{zi}^2 + k_{\rho i}^2$, $$k_{\rho 1}=(\in_1 k_o^2-(\pi/L)^2)^{1/2} \quad (49)$$

$$k_{z2}=((\in_2-\in_1)k_o^2-(\pi/L)^2)^{1/2} \quad (50)$$

$$k_{\rho 2}=(\in_2 k_o^2-(\pi/L)^2)^{1/2}. \quad (51)$$

A first design rule is that the plate and cylinder regions 401a–f, 402a–c (FIG. 5) have thicknesses equal to one-quarter of the wavelength of the desired input signal. This maximizes the reflectivities of the plate and cylinder regions, and thus minimize the number of sections needed. It is an additional design advantage that the quarter wavelength thickness generates zero phase shift for the reflected waves. Therefore, each plate region 401a–f has a thickness given by $$T_Z = \frac{(\pi/2)}{k_{z2}} \quad (52)$$

and the cylinder region 402a–c thickness is given by $$T_\rho = \frac{(\pi/2)}{k_{\rho 2}}. \quad (53)$$

The next step is to determine the radius of the resonant optical cavity 500 as determined by the inner cylinder region 402a. This is calculated by reapplying the resonance condition describe above, demanding that the resonant mode undergoes a phase shift of an integral multiple of $2\pi$ for a round trip between the origin at $\rho=0$ and the first interface of the inner cylinder region defining the resonant optical cavity 500. A radially propagating electric field solution of the wave equation in the resonant optical cavity 500 is a Hankel function of the first kind, defined by $H_1^{(1)}(x)=J_1(x)+iY_1(x)$. The resonance condition is satisfied for a phase distance corresponding to the first zero of the Bessel function $J_1$, denoted by $x_{11}$. From this condition, the inner radius of the first cylinder region 402a defining the resonant optical cavity 500 is determined $$\rho_1 = \frac{x_{11}}{k_{\rho 1}}. \quad (54)$$

Having determined the positions and thicknesses of the plate and cylinder regions defining the resonant optical cavity 500, it is straightforward to extend the arguments to calculate the positions of the additional plate and cylinder regions 401a–f, 402a–c comprising the embedded DBR resonant structure 400. It should be noted that the reflective surfaces defining the central cavity 500 have been placed at what would be the E-field nulls of a simple cavity uniformly filled with material of dielectric constant $\in_1$.

Additional plate region positions are determined by extending the resonant optical cavity 500 harmonic solution along the z-axis, and placing the inner surfaces of each additional plate region reflector at the sequential field nulls. The harmonic solution phase shift is corrected for an additional phase drop across the plate regions interior to the current position. This correction takes place because each plate causes a slight movement in the location where the next E-field null is expected to occur. Therefore, when placing the second plate pair 401b and 401e, one must account for a slight displacement of the second E-field null by the first plate pair 401c and 401d. In turn, when placing the third plate pair 401a and 401f, one must account for a slight displacement of the third E-field null by the first and second plate pairs 401c and 401d, and 401b and 401e, respectively.

Similarly, additional cylinder region positions are determined by extending the resonant optical cavity 500 radial Bessel function solution, and placing the inner surface of each additional cylinder region reflector at the positions of the E-field nulls, again correcting for an additional phase shift induced by the cylinder regions interior to the current position.

This design algorithm maintains the coherent reflection requirements previously described, and is simply and physically motivated. The accuracy of these rules was verified by the detailed calculations described above.

An example of an optically resonant system formed according to the aforementioned design rules in one embodiment, among others, could comprise three cylinders and 6 plates, the plates and cylinders made from silicon ($\kappa=11.56$), while an optical substrate is made from silicon dioxide ($\kappa=2.25$). To capture an optical signal having a wavelength of 1.55 $\mu$m, the first cylinder 402a would have an inner radius of 1.140 $\mu$m, and an outer radius of 1.265 $\mu$m. The second cylinder 402b, would have an inner radius of 1.737 $\mu$m and an outer radius of 1.860 $\mu$m. Finally, the third cylinder would have an inner radius of 2.329 $\mu$m and an outer radius of 2.452 $\mu$m. Each of the plates would have a thickness of 0.1175 $\mu$m, with 0.310 $\mu$m spacing between each of the plates, with the exception of the plates bordering the central cavity. The plates 401c, 401d bordering the central cavity would have a spacing of 0.620 $\mu$m between them. Thus, the resonant optical cavity, in one embodiment, among others, could have a height of 0.620 $\mu$m and a radius of 1.140 $\mu$m, in order to capture an optical signal with a wavelength of 1.55 $\mu$m.

Figure 11:
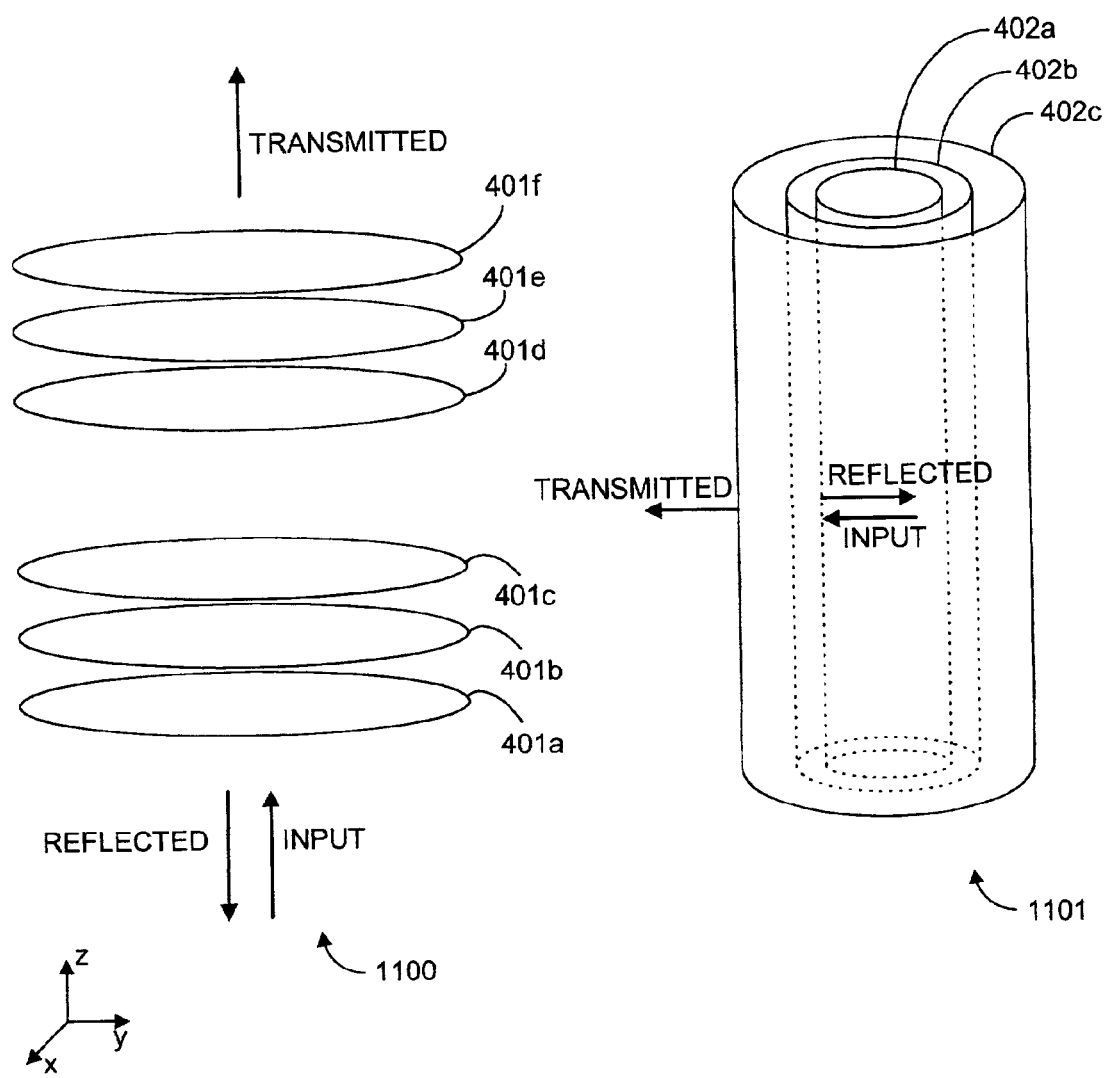
FIG. 11 is an illustration showing the operation of the optically resonant system of FIG. 5.
Figure 12:
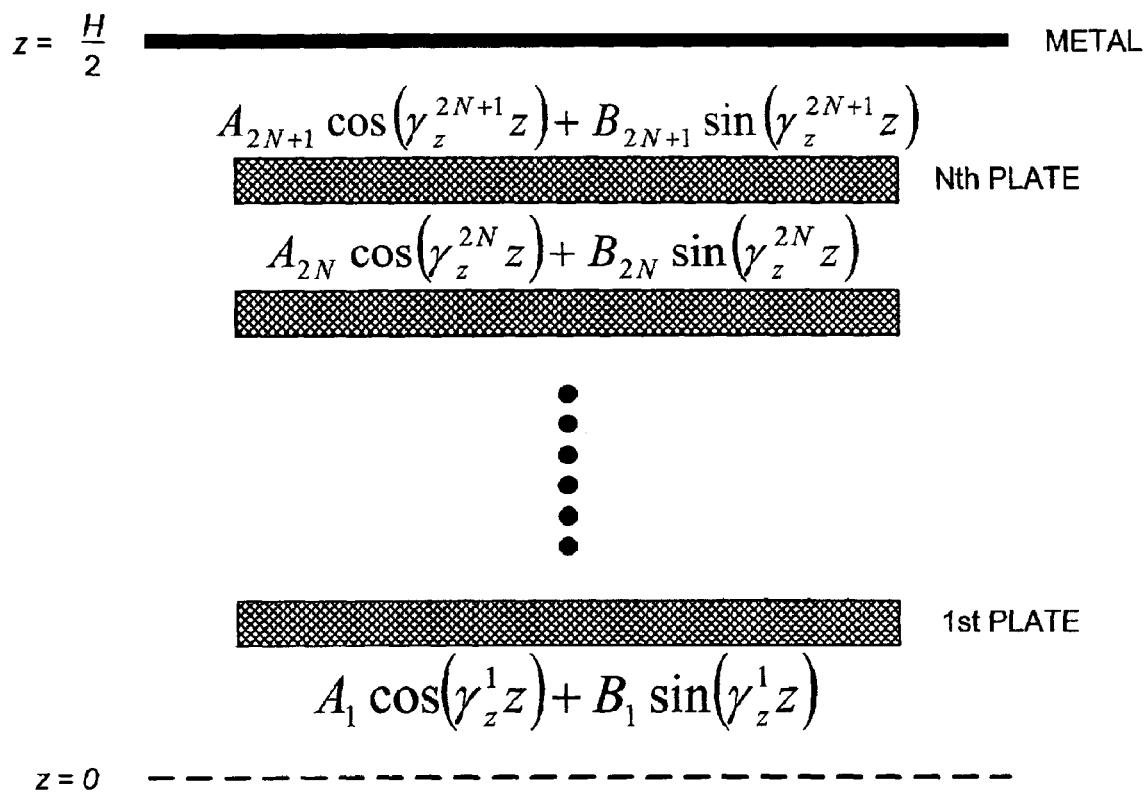
FIG. 12 is a block diagram illustrating the structure and waveforms that were used to solve for the z-dimensional (orthogonal) dependence of the optically resonant system shown in FIG. 5.

Referring now to FIG. 15, as described with respect to FIGS. 10 and 11, shown is an asymmetric optically resonant cavity. In order to enable the optically resonant system 400 to preferentially radiate light out of the substrate surface plane 1500, the optically resonant system is formed asymmetrically by forming the optically resonant system without an even number of plates 401a–e. In this way, the dominant radiation mechanism for the asymmetric optically resonant system 1501 is no longer in the radial direction into the substrate 501, but is out of the plane, as indicated by radiation 1502 in FIG. 15.

Calculation of the optical radiation of the asymmetric optically resonant system 1501 is difficult for a number of reasons. The removal of the confining boundary condition at the upper surface precludes an analytical solution for a radiating resonant mode. Also, the radiation resonant modes are not normalizable, making an approximate mode matching procedure unworkable. As a result, the best means of approximately calculating the radiation properties of the structure of FIG. 15 is perturbative.

It is assumed, for the sake of calculating the optical radiation, that resonant mode fields at the upper surface of the asymmetric optically resonant system 1501 are the same as fields that would exist if the optically resonant system were symmetric. If the resonator Q remains relatively large even with optical radiation effects taken into account, this is probably a reasonable approximation. Given these resonant mode fields, on what is assumed to be an infinite planar surface (impressed fields are assumed to be zero away from the asymmetric optically resonant system aperture). Green's second identity can be applied to find the fields at any point in the half-space above the substrate surface 1500. The expressions for electric and magnetic fields far from the substrate surface 1500 take the form $$\vec{E}(\vec{x}) = \frac{e^{ikr}}{4\pi i r}\vec{k} \times \oint_S e^{-i\vec{k}\cdot\vec{s}'}\left[-\frac{\vec{k}\times(\hat{n}'\times\vec{B}(\vec{x}'))}{k/c} - \hat{n}'\times\vec{E}(\vec{x}')\right]da' \quad (55)$$

$$\vec{B}(\vec{x}) = \frac{e^{ikr}}{4\pi i r}\vec{k} \times \oint_S e^{-i\vec{k}\cdot\vec{s}'}\left[-\frac{\vec{k}\times(\hat{n}'\times\vec{E}(\vec{x}'))}{kc} - \hat{n}'\times\vec{B}(\vec{x}')\right]da' \quad (56)$$

where r is the distance from the point on the surface to the observation point, $\vec{k}$ is the free space wave vector, da' is the surface area differential element to be integrated over the surface S, and $\hat{n}$ is the surface normal unit vector. Resonator fields on the surface S needed to complete the integrations of Equations (55) and (56) are known from the previous calculations. The asymmetric optically resonant system mode solutions are given as products of Bessel and trigonometric functions as shown in Equations (9, 10, and 13–15). This simple solution form allows the integrals of Equations (23) and (24) to be done analytically yielding closed form expressions for the radiated fields.

As a typical example, a structure including ten cylinder regions and three plate pair regions, with dielectric constants of 11.56 and 2.25 for the optically resonant system 1501 and background regions 501, respectively, is specified using the design rules. For the complete optically resonant system 400, without any asymmetric structure to enhance out-of-plane radiation, the computed Q of the resonator is $1.0 \times 10^8$, when no materials losses are taken into account. This computed Q is only due to radiation losses in the radial direction into the substrate 501. A measured Q would, of course, be much lower due to materials losses. If the optically resonant system 400 is built asymmetrically without the top high-dielectric plate region, radiation out of the substrate is calculated to generate a Q of $2 \times 10^6$. In other words, for the resonant mode of the asymmetric optically resonant system 1501, roughly 50-times more energy is likely to escape through the upper surface of the asymmetric optically resonant system 1501 than leak into the substrate 501. If the optically resonant system 1501 is built asymmetrically without the top two high-dielectric plate regions, radiation out of the substrate is calculated to generate a Q of $5.7 \times 10^4$. For this configuration, it is seen that the asymmetrical optically resonant system 1501 radiates very strongly out of the substrate, with roughly 2000-times more energy radiated out of the substrate than into the substrate. From the example, it is clear that the coupling of the asymmetric optically resonant system resonant modes to radiation fields out of the substrate can be adjusted over a very broad range.

In sum, an efficient out-of-plane coupler has been realized using an optically resonant system with a resonant cavity that can be formed in an integrated optic device. The optically resonant system can transfer optical energy from a proximal component of the integrated optic device, such as a waveguide, and direct it out of the optically resonant system with calculable coupling efficiency. Additionally, the output of the optically resonant system has the advantage of being axially symmetric, with a beam diameter on the order of the radiation wavelength.

It should be emphasized that the above-described embodiments of the present invention are merely possible examples of implementations set forth for a clear understanding of the principles of the invention. Many variations and modifications may be made to the above-described embodiment(s) of the invention without departing substantially from the principles of the invention. All such modifications and variations are intended to be included within the scope of this disclosure and the presented invention and protected by the following claims.

What is claimed is:

1. An optically resonant system for redirecting an optical signal, said optically resonant system comprising:

a first structure residing substantially in a plane and reflecting optical radiation in a first direction substantially orthogonal to said plane;

a second structure overlapping, and optically communicating with said first structure, and reflecting optical radiation in a direction substantially parallel to said plane; and a substrate of a material having a lower dielectric constant than a dielectric constant of each of said first and said second structures that are located at least partially in said substrate;

wherein said first and second structures operate to capture at least a portion of a first optical signal propagating substantially parallel to said plane by exciting a resonant signal in a resonant cavity through resonant characteristics of said first and second structures, and further operate to emit said resonant signal in a second direction substantially orthogonal to said plane.

2. The system of claim 1, wherein said first structure comprises at least one plate; and wherein said second structure comprises at least one cylindrically-shaped structure.

3. The system of claim 1, further comprising:

a resonant optical cavity defined by said first and second structures, said resonant optical cavity defining at least one wavelength of the first optical signal that can be captured and redirected by said first and second structures.

4. The system of claim 1, wherein said substrate comprises silicon dioxide; and wherein said first and second structures comprise silicon.

5. The system of claim 1, further comprising:

a waveguide formed in said substrate, said waveguide directing the first optical signal toward said resonant optical cavity.

6. The system of claim 1, further comprising:

means for propagating a wave in said substrate toward said resonant optical cavity.

7. The system of claim 1, further comprising:

a waveguide formed in said substrate, said waveguide being proximally located with respect to said resonant optical cavity, such that the optical signal energy from said waveguide is transferred to said resonant optical cavity through an evanescent field radiating from said waveguide and excites a plurality of modes within said resonant optical cavity.

8. The system of claim 1, wherein said emitted resonant signal exhibits an axially symmetric radiation pattern.

9. The system of claim 8, further comprising:
an optical fiber optically coupled to at least one of said first and second structures such that the emitted resonant signal can be transported.

10. An optically resonant system for redirecting an optical signal, said optically resonant system comprising:
a substrate;
a planar waveguide located at least partially in said substrate, said waveguide operative to transport an input optical signal that exhibits a directional component; and
a resonant optical cavity located at least partially in the substrate said cavity configured to optically couple to said waveguide to receive an evanescent optical signal of the input optical signal, said resonant optical cavity resonating in response to the evanescent optical signal to excite and emit a resonant signal, the resonant signal exhibiting a directional component different than the directional component of the input optical signal, and wherein said resonant optical cavity is bounded by
a first structure residing substantially in a plane and reflecting optical radiation in a first direction substantially orthogonal to said plane; and
a second structure optically communicating with said first structure and reflecting optical radiation in a direction substantially parallel to said plane.

11. The optically resonant system of claim 10, wherein said first and second structures have dielectric constants higher than the optical cavity dielectric constant, such that a substantial portion of optical energy of the input optical signal is captured within said resonant optical cavity.

12. The system of claim 11, wherein said planar waveguide carrying the input optical signal is substantially parallel to said plane and is proximally located with respect to said resonant optical cavity; and
wherein the directional orientation of the resonant signal is substantially orthogonal to said plane, and has an axially symmetric radiation pattern.

13. The system of claim 12, further comprising:
an optical fiber optically coupled to said resonant optical cavity such that the resonant signal can be transmitted through said optical fiber.

14. A method for redirecting optical radiation, said method comprising:
receiving an evanescent field signal of a first optical signal having a directional component and including at least one wavelength;
exciting a resonant signal with the evanescent field signal at said at least one wavelength; and
emitting said resonant signal having a directional component that is substantially orthogonal to the directional component of the first optical signal.

15. The method of claim 14, wherein the receiving step comprises:
receiving the evanescent optical signal directly from a waveguide.

16. The method of claim 14, wherein the receiving step comprises:
exciting a plurality of modes of a resonant optical cavity with the evanescent optical signal radiated from a proximally located waveguide carrying the first optical signal.

17. The method of claim 14, further comprising:
emitting said resonant signal in an axially symmetric radiation pattern.

18. The method of claim 17, further comprising:
providing an optical fiber waveguide;
coupling said optical fiber waveguide to said emitted resonant signal; and
transporting said emitted resonant signal using said optical fiber waveguide.

19. The method of claim 18, further comprising:
providing a resonant optical cavity having dimensions such that said resonant optical cavity resonates with at least one frequency of light to receive the first optical signal;
exciting at least one of a plurality of modes of said resonant optical cavity to excite said resonant signal;
providing a weakened portion of said resonant optical cavity to emit said resonant signal.

20. A system for redirecting an optical signal, the system comprising:
a first structure comprising a first cylinder having an axis, the first cylinder operative to capture at least a portion of an evanescent optical signal propagating radially therethrough and to provide radial confinement of the captured optical signal; and
a second structure comprising a first plate and a second plate spaced apart along the axis, the first and second plates operative to provide axial confinement of the captured optical signal;
wherein the first and second structures constitute an optical resonator operative to resonate and direct the captured optical signal out of the system in the axial direction;
wherein the first and second structures are disposed at least partially inside a substrate;
wherein the first and second structures comprise a material having a first dielectric constant and the substrate comprises a material having a second dielectric constant; and
wherein the first dielectric constant is greater than the second dielectric constant.

21. The system of claim 20, wherein the first structure further comprises a second cylinder separated from the first cylinder by an annular spacing, the annular spacing being determined by a wavelength of the captured optical signal.

22. The system of claim 20, wherein the first plate is separated from the second plate by a first coaxial spacing that is determined by a wavelength of the optical signal.

23. The system of claim 20, wherein the physical dimensions of each of the first and second structures is determined by a wavelength of the optical signal.

* * * * *